United States Patent
Terashima

(10) Patent No.: US 6,472,710 B2
(45) Date of Patent: Oct. 29, 2002

(54) FIELD MOS TRANSISTOR AND SEMICONDUCTOR INTEGRATED CIRCUIT INCLUDING THE SAME

(75) Inventor: Tomohide Terashima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/881,805

(22) Filed: Jun. 18, 2001

(65) Prior Publication Data

US 2002/0066930 A1 Jun. 6, 2002

(30) Foreign Application Priority Data

Dec. 1, 2000 (JP) ........................................ 2000-367211

(51) Int. Cl.$^7$ ............................................ H01L 31/113
(52) U.S. Cl. ..................... 257/343; 257/368; 257/360; 257/409; 257/509
(58) Field of Search ................................ 257/360–362, 257/368, 396, 343, 409, 648, 509, 500, 502, 544, 492, 493, 357; 438/309, 199

(56) References Cited

U.S. PATENT DOCUMENTS

| | | | | |
|---|---|---|---|---|
| 4,228,448 A | * | 10/1980 | Lalumia et al. ................ 357/46 |
| 5,416,039 A | * | 5/1995 | Yilmaz et al. ................. 437/33 |
| 5,455,189 A | * | 10/1995 | Grubisich ..................... 437/34 |
| 5,489,799 A | * | 2/1996 | Zambrano et al. .......... 257/587 |
| 5,508,549 A | * | 4/1996 | Watanabe et al. ............ 257/370 |
| 5,883,413 A | * | 3/1999 | Ludikhuize .................. 257/343 |
| 6,236,084 B1 | * | 5/2001 | Harada et al. ............... 257/338 |
| 6,365,941 B1 | * | 4/2002 | Rhee ............................ 257/357 |
| 2001/0038125 A1 | * | 11/2001 | Ohyanagi et al. ........... 257/347 |
| 2001/0040266 A1 | * | 11/2001 | Pozzoni et al. .............. 257/500 |

FOREIGN PATENT DOCUMENTS

JP 8-321560 12/1996

OTHER PUBLICATIONS

"Thin Layer High–Voltage Devices (RESURF Devices)", J. S. Appels et al., pp. 1–5, Philips Journal of Research, vol. 35, No. 1, 1980.

* cited by examiner

Primary Examiner—Steven Loke
Assistant Examiner—Douglas L. Owens
(74) Attorney, Agent, or Firm—McDermott, Will & Emery

(57) ABSTRACT

A field MOS transistor having a high withstand voltage is disclosed. An island region of an epitaxial layer is surrounded by a heavily-doped isolation layer and a lightly-doped isolation layer formed thereon. A channel region is formed in the island region so as to assume the same doping level as that of the lightly-doped isolation layer. A region is formed below the island region so as to assume the same doping level as that of the heavily-doped isolation layer, thus supplying a back gate voltage to the transistor. The channel formation region is formed simultaneously with formation of the lightly-doped isolation layer, and the region below the island region is formed simultaneously with the heavily-doped isolation layer. As a result, manufacturing processes can be simplified.

10 Claims, 5 Drawing Sheets

FIELD MOS TRANSISTOR AND SEMICONDUCTOR INTEGRATED CIRCUIT INCLUDING THE SAME

BACKGROUND OF THE INVENTION

1. Field of the Invention

The present invention relates to a field MOS transistor used in a discrete semiconductor device or a high-voltage semiconductor integrated circuit, as well as to a semiconductor integrated circuit including the field MOS transistor.

The field MOS transistor is a MOS transistor which uses, as a gate insulating film, a comparatively-thick field insulating film formed on a semiconductor device. The field MOS transistor is used with a circuit requiring a high gate voltage, by means of utilization of the thickness of the gate insulating film. The field MOS transistor is used as a discrete semiconductor device in an application in which a signal is amplified or modified in accordance with a high gate voltage. In the field of a high-voltage semiconductor integrated circuit, the field MOS transistor is used as a sense element for sensing a high output voltage produced by a digital switching element or a gate protection element located in an integrated circuit.

2. Background Art

FIG. 9 shows the configuration of a related-art field MOS transistor of this type. An island region 2A is formed by means of surrounding, with a $P^+$-isolation layer 3 and a P-well layer 4, a certain area in an $N^-$-epitaxial layer 2 formed on a $P^-$-type semiconductor substrate 1. An N-channel field MOS transistor is fabricated in the island region 2A. The N-channel field MOS transistor is constituted of a P-well 4A formed in a surface portion of the island region 2A, and an N-source region 5 and an N-drain region 6, which are formed in the P-well 4A. A gate electrode 10 is formed on a field insulating film 9 formed on the P-well 4A and between the source region 5 and the drain region 6. A source electrode 11 supplies a back-gate potential to the P-well 4A by way of a $P^+$-diffusion layer 7 and is in contact with the source region 5. Further, a drain electrode 12 is in contact with the drain region 6 by way of the $N^+$-diffusion layer 8.

In the configuration of the related-art field MOS transistor shown in FIG. 9, a junction withstand voltage between the drain region 6 and the P-well 4A determines the element withstand voltage of the overall transistor. The P-well 4A has the same doping level as that of the P-well 4 used for isolating the island region 2A. The doping level is comparatively high, and hence the element withstand voltage cannot be increased to a sufficiently high level. In a CMOS integrated circuit, the P-well 4A is often used for supplying a back-gate voltage to a CMOS transistor. From the viewpoint of preventing occurrence of parasitic operation and a punch-through phenomenon, the P-well 4 is set to a comparatively high doping level.

The configuration of such a related-art field MOS transistor imposes limitations on improvement of an element withstand voltage.

Hence, implementation of a field MOS transistor having a sufficient withstand voltage is difficult. For example, a circuit such as that shown in FIG. 3, an inverter circuit, or an analog circuit, any of which requires an element withstand voltage equal to the maximum gate voltage, usually requires a withstand voltage ranging from several tens of volts to one hundred and several tens of volts.

However, implementation of such an element withstand voltage using the configuration of the related-art field MOS transistor is impossible.

Philips Electronics has put forward a method of forming an $N^+$-diffusion region in the island region 2A of the $N^-$-epitaxial layer 2, thus fabricating a high-withstand-voltage diode between the $N^+$-diffusion region and the P-type semiconductor substrate 1. The configuration of, a high-withstand-voltage diode is introduced as a RESURF diode in Philips Journal of Research (Vol. 35, No.1, 1980, pp. 1 through 5). The journal shows that a high withstand voltage can be achieved by means of reducing the concentration of an epitaxial layer. The journal shows the configuration of a high-withstand-voltage diode, but fails to show a technique for increasing the withstand voltage of a field MOS transistor.

SUMMARY OF THE INVENTION

The present invention proposes a new field MOS transistor enabling an improvement in element withstand voltage, and a semiconductor integrated circuit including the field MOS transistor.

According to one aspect of the present invention, a field MOS transistor comprises a semiconductor substrate of first conductivity type and an epitaxial layer of second conductivity type formed on the semiconductor substrate. A field insulating film is formed on the epitaxial layer. A heavily-doped isolation layer of first conductivity type is formed in a predetermined location on the semiconductor substrate and surrounds an island region of the epitaxial layer. A lightly-doped isolation layer of first conductivity type is formed on the heavily-doped isolation layer, and the lightly-doped isolation layer, along with the heavily-doped isolation layer, surrounds the island region of the epitaxial layer. A channel formation region is formed so as to be joined to a lower surface of the field insulating film, and has substantially the same doping level as that of the lightly-doped isolation layer. A gate electrode is formed on the field insulating film above the channel formation region. Further, a source region and a drain region of second conductivity type are respectively formed within the island region of the epitaxial layer and on the opposite sides of the channel formation region.

In another embodiment of the present invention, the field MOS transistor preferably comprises an extended region which has substantially the same doping level as that of the heavily-doped isolation layer and extends below the island region of the epitaxial layer, and the channel formation region is formed preferably on the extended region. Further, the extended region may preferably be extended from the heavily-doped isolation layer.

According to another aspect of the present invention, a field MOS transistor comprises a semiconductor substrate of first conductivity type and an epitaxial layer of second conductivity type formed on the semiconductor substrate. A field insulating film is formed on the epitaxial layer. A heavily-doped isolation layer of first conductivity type is formed in a predetermined location on the semiconductor substrate and surrounds an island region of the epitaxial layer. A lightly-doped isolation layer of first conductivity type is formed on the heavily-doped isolation layer, and the lightly-doped isolation layer, along with the heavily-doped isolation layer, surrounds the island region of the epitaxial layer. An embedded layer of second conductivity type is formed below an island region of the epitaxial layer. Another embedded layer of first conductivity type is formed on the embedded layer of second conductivity type, and has substantially the same doping level as that of the heavily-doped isolation layer. A channel formation region of first conductivity type is formed on the embedded layer of first conductivity type so as to be joined to a lower surface of the field insulating film, and the channel formation region has substantially the same doping level as that of the lightly-doped isolation layer. A gate electrode is formed on the field insulating film above the channel formation region. Further, a source region and a drain region of second conductivity type are respectively formed on the embedded layer of first conductivity type and on the opposite sides of the channel formation region.

Other and further objects, features and advantages of the invention will appear more fully from the following description.

DETAILED DESCRIPTION OF THE PREFERRED EMBODIMENTS FIRST EMBODIMENT

Figure 1:
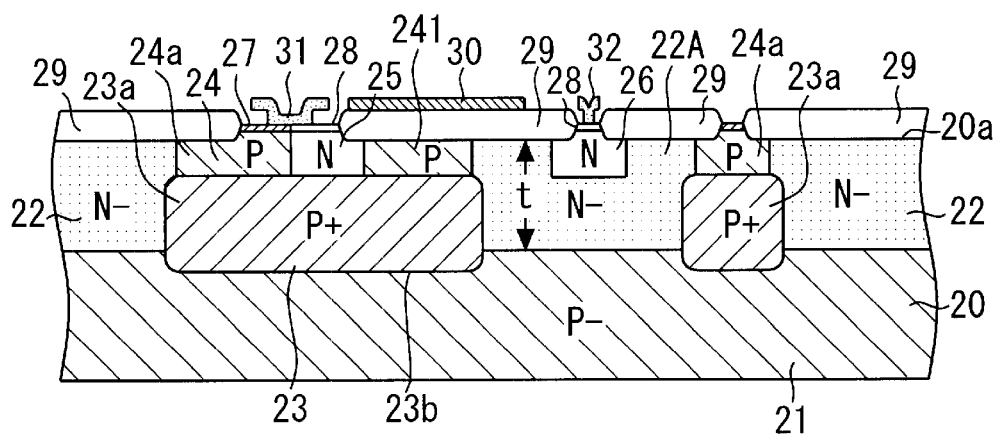
FIG. 1 is a cross-sectional view showing a field MOS transistor according to a first embodiment of the present invention.

FIG. 1 is a cross-sectional view showing a field MOS transistor according to the present invention.

The field MOS transistor is primarily composed of a semiconductor base member 20 including a semiconductor substrate 21 and an epitaxial layer 22. The semiconductor base member 20 is formed from, for example, silicon. A primary surface 20a is formed on the semiconductor base member 20. The semiconductor base member 20 is formed with the semiconductor substrate 21 as starting material. The semiconductor substrate 21 is of first conductivity type; for example, P type. More specifically, the semiconductor substrate 21 is formed from a P$^-$-semiconductor of low doping level.

Figure 2:
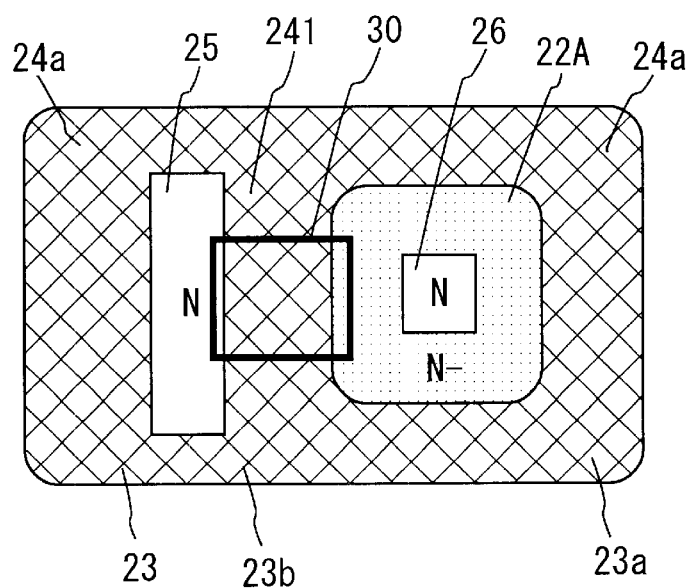
FIG. 2 shows a plan view of the ring-shaped portion of the field MOS transistor shown in FIG. 1.

An epitaxial layer 22 is formed on the semiconductor substrate 21. The epitaxial layer 22 is of second conductivity type; for example, N type. More specifically, the epitaxial layer 22 is of an N$^-$-semiconductor having a low concentration of N-type impurities. The upper surface of the epitaxial layer 22 defines the primary surface 20a. A heavily-doped P$^+$-embedded layer 23—which is of first conductivity type; for example, P type, and is doped with a high concentration of impurities—is formed in a predetermined area on the semiconductor substrate 21. The heavily-doped embedded layer 23 has a ring-shaped portion 23a and an extended portion 23b. The extended portion 23b extends from a portion of the internal periphery of the ring-shaped portion 23a to the inside of the ring-shaped member 23a. The ring-shaped member 23a constitutes a heavily-doped isolation layer. FIG. 2 shows a plan view of the ring-shaped portion of the field MOS transistor shown in FIG. 1.

The ring-shaped portion 23a and the extended portion 23b, both belonging to the heavily-doped embedded layer 23, are identical in distribution of doping level. Each of the ring-shaped portion 23a and the extended portion 23b has a diffused portion extending into the semiconductor substrate 21, and another diffused portion extending into the epitaxial layer 22. In short, each of the ring-shaped portion 23a and the extended portion 23b is formed so as to extend between the semiconductor substrate 21 and the epitaxial layer 22. The heavily-doped embedded layer 23 is formed by means of introducing P-type impurities into a predetermined area on the upper surface of the semiconductor substrate 21 with diffusion or ion implantation before formation of the epitaxial layer 22. Subsequently, the epitaxial layer 22 is grown on the entire surface of the semiconductor substrate 21, including the heavily-doped embedded layer 23, and is subjected to heat treatment. As a result, P-type impurities of the heavily-doped embedded layer 23 are diffused into the semiconductor substrate 21 and the epitaxial layer 22.

A P-region (i.e., P-well) 24 is formed on the heavily-doped isolation layer 23a. The p-region 24 is of first conductivity type or P-type and has a doping level which is lower than that of the embedded layer 23 but higher than that of the semiconductor substrate 21. The P-well 24 comprises a ring-shaped portion 24a situated on the ring-shaped heavily-doped isolation layer 23a of the embedded layer 23, and a channel formation region 241 which is spaced away from the ring-shaped portion 24a and is formed along the internal periphery of the ring-shaped portion 24a. The ring-shaped portion 24a of the P-well 24 constitutes a lightly-doped isolation layer. The lightly-doped isolation layer 24 and the channel formation region 241 are identical in distribution of doping level. The lightly-doped isolation layer 24a and the channel formation region 241 are formed by means of selectively introducing P-type impurities into predetermined areas on the primary surface 10a of the epitaxial layer 22 formed over the entire surface of the semiconductor substrate 21, with diffusion or ion implantation.

The heavily-doped isolation layer 23a and the lightly-doped isolation layer 24a are each formed into a ring shape and are bonded together in the vertical direction. The heavily-doped isolation layer 23a and the lightly-doped isolation layer 24a surround the island region 22A of the epitaxial layer 22 located within the heavily-doped isolation layer 23a and the lightly-doped isolation layer 24a. The island region 22A is isolated from the epitaxial layer 22 located around the island region 22A.

In addition to the channel formation region 241, a source region 25 and a drain region 26, which are of second conductivity type; that is, N-type, are formed in the island region 22A. The source region 25, the drain region 26, and the epitaxial layer 22 are higher in doping level than the island region 22A. The source region 25 is formed on the left side of the channel formation region 241 so as to be joined to both the channel formation region 241 and the ring-shaped portion 24a. The drain region 26 is formed on the right side of the channel formation region 241 so as to be spaced away from the channel formation region 241 and the ring-shaped portion 24a.

The source region 25 and the drain region 26 are formed to the same depth as that of the P-well 24, by means of selectively introducing N-type impurities into the epitaxial layer 22 from predetermined locations on the primary surface 10a with diffusion or ion implantation. The extended portion 23b of the embedded layer 23 is an area extending to a position below the island region 22A. The source region 25 and the channel formation region 241 are formed so as to be joined to the extended portion 23b.

The primary surface 20a is coated with a thick field insulating film 29. In FIG. 1, the field insulating film 29 is formed so as to cover the island region 22A, the P-well 24, the channel formation region 241, the source region 25, and the drain region 26, as well as the epitaxial layer 22. The field insulating film 29 is formed by means of oxidization of the layers underlying the field insulating film 29. The P-well 24, the source region 25, and the drain region 26 are formed so as to be joined to the lower surface of the field insulating film 29.

The field insulating film 29 is opened at a position located where the source region 25 and the lightly-doped isolation layer 24a adjoin. Within the opening, a source electrode 31 is in ohmic-contact with the lightly-doped isolation layer 24a and the source region 25 by way of a P$^+$-diffused film 27 and an N$^+$-diffused film 28. Further, the portion of the field insulating film 29 corresponding to the drain region 26 is also opened. A drain electrode 32 is in ohmic-contact with the drain region 26 by way of the N$^+$-diffused film 28. The gate electrode 30 is formed on the area of the field insulating film 29 corresponding to the position of the channel formation region 241.

In the first embodiment, the drain region 26 is surrounded by the island region 22A of the epitaxial layer 22. The configuration of the field MOS transistor is analogous to that of the previously-described RESURF diode. The with stand voltage; i.e., an element withstand voltage, of the drain region 26 can be increased by means of diminishing the doping level of the epitaxial layer 22 and that of the island region 22A.

The island region 22A can surround the drain region 26 by means of leaving the island region 22A around the drain region 26. This can be achieved by means of forming the channel formation region 241 with the same doping level as that of the lightly-doped isolation layer 24a and supplying a back-gate voltage to the extended portion 23b from the source electrode 31 by way of the lightly-doped isolation layer 24a and the heavily-doped isolation layer 23a.

In connection with a configuration in which the drain region 26 is surrounded by the island region 22A of the epitaxial layer 22, in a case where a doping level ρ and thickness "t" of the island region 22A satisfy the following relationship, a sideward junction withstand voltage of the drain region 26 along the surface of the primary surface 20a can be made sufficiently large. As a result, the overall element withstand voltage of the CMOS transistor can be sufficiently increased to a one-dimensional withstand voltage of a p-i-n junction formed from the drain region 26, the island region 22A, and the substrate 21.

$$q \cdot \rho \cdot t / \epsilon < E_{cr}$$

where "q" designates the electric charge of an electron, $\epsilon$ designates the insulating constant of silicon, and Ecr designates a critical electric field of a p-n junction.

The extended portion 23b can be formed through the same process as that by which the heavily-doped isolation layer 23a is to be formed, and the channel formation region 241 can be formed through the same process as that by which the lightly-doped isolation layer 24a is to be formed. Hence, in terms of manufacturing process, the field MOS transistor according to the embodiment does not require addition of special processes. Further, the source region 25 and the drain region 26 can be readily formed to the same depth as that of the channel formation region 241 in a process in which an N-well having the same depth as that of the P-well 24 is to be formed, after formation of, e.g., the P-well 24.

Application Circuit 1

Figure 3:
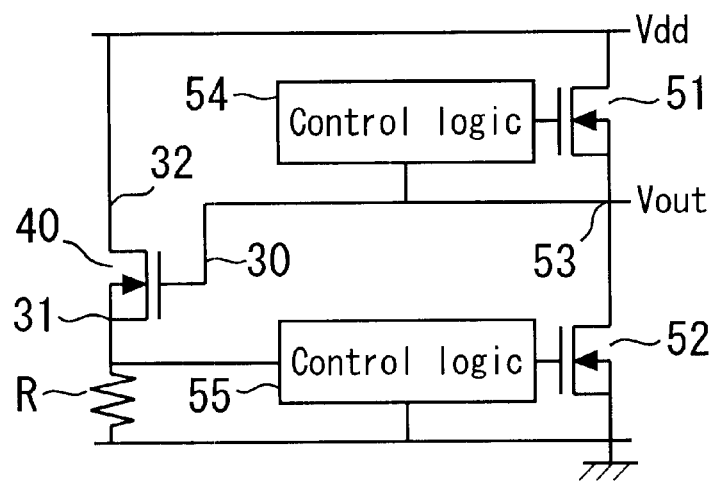
Fig. 3 is an electric circuit diagram of the application circuit 1 according to the first embodiment.

A circuit 1 is an application circuit to which the field MOS transistor according to the first embodiment is applied, and FIG. 3 is an electric circuit diagram of the application circuit 1. In FIG. 3, the field MOS transistor described in connection with the first embodiment is designated by reference numeral 40.

An output voltage Vout is output from a junction 53 of a pair of N-channel MOS transistors 51 and 52 connected to a high-voltage supply voltage Vdd. A control logic circuit 54 is connected between the gate electrode and the source electrode of the transistor 51, and a control logic circuit 55 is connected between the gate electrode and the source electrode of the transistor 52. The gate electrode 30 of the field MOS transistor 40 is connected to the output voltage Vout, and the drain electrode 32 of the MOS transistor 40 is connected directly to the high-voltage supply voltage Vdd. The source electrode 31 is grounded by way of a resistor R.

In the circuit shown in FIG. 3, the output voltage Vout changes from 0 to Vdd. A drain current Id of the transistor 40 changes in accordance with Vout. As a result, a corresponding voltage develops in the resistor R. The output voltage Vout can be sensed (monitored) on the basis of the voltage developing in the resistor R. A high voltage Vdd is supplied directly to the drain electrode 32 of the MOS transistor 40. However, by means of the high-withstand-voltage structure described in connection with the first embodiment, the transistor 40 can perform its function under this condition.

Application Circuit 2

Figure 4:
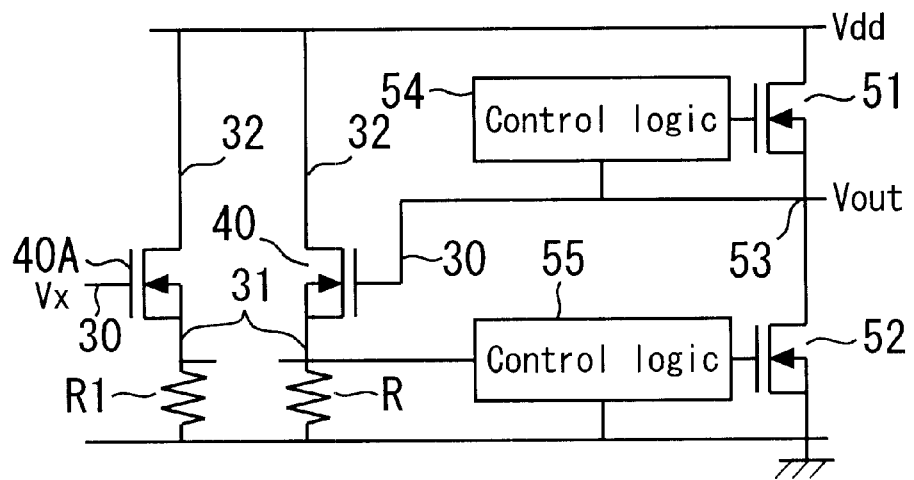
FIG. 4 is an electrical circuit diagram of the application circuit 2 according to the first embodiment.

A circuit 2 is also an application circuit to which the field MOS transistor according to the first embodiment is applied. The application circuit 2 is a modification of the application circuit 1, and FIG. 4 is an electrical circuit diagram of the application circuit 2. In the application circuit 2, another field MOS transistor 40A according to the present invention is connected in parallel with the transistor 40. A reference voltage Vx is supplied to a gate electrode 30 of the transistor 40A. A voltage developing in a resistor R1 connected to a source electrode 31 of the transistor 40A is compared with the voltage developing in the resistor R, thereby determining the absolute value of the output voltage Vout. In other respects, the application circuit 2 is identical in configuration with the application circuit 1.

The drain electrode 32 of the field MOS transistor 40 and a drain electrode 32 of the field MOS transistor 40A, which are shown in FIG. 4, are connected to the high-voltage supply voltage Vdd. By virtue of an improvement in with stand voltage attributable to the present invention, the MOS transistors 40 and 40A can perform their initial functions.

Second Embodiment

Figure 5:
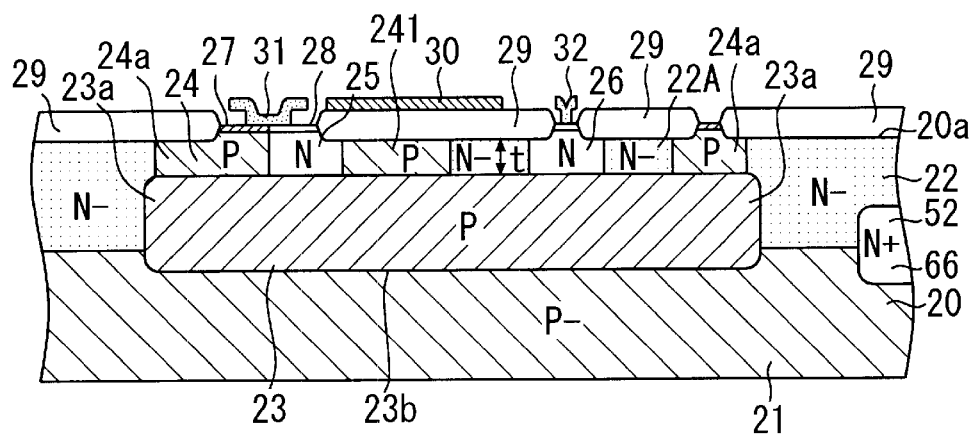
FIG. 5 is a cross-sectional view showing a field MOS transistor according to a second embodiment.

FIG. 5 is a cross-sectional view showing a field MOS transistor according to a second embodiment of the present invention. The second embodiment is directed toward a further improvement in the heavily-doped embedded layer 23 according to the first embodiment shown in FIG. 1.

In the second embodiment shown in FIG. 5, the extended portion 23b of the heavily-doped embedded layer 23 is extended so as to extend over the island region 22A of the epitaxial layer 22. As a result, the extended portion 23b spreads over the area surrounded by the ring-shaped portion 23a. A drain region 26 is formed on and joined to the extended portion 23b. In other respects, the field MOS transistor is identical in configuration with that shown in FIG. 1. Even in the second embodiment, the island region 22A of the epitaxial layer 22 is left in the surface portion to a thickness t1. The thickness t1 and the doping level ρ are set so as to satisfy the above requirements, thereby improving the element withstand voltage of the field MOS transistor in the same manner as in the first embodiment.

In the second embodiment shown in FIG. 5, an $N^+$-drain region 66 of another N-channel MOS transistor 52 is formed outside the heavily-doped isolation layer 23a so as to extend between the epitaxial layer 22 and the semiconductor substrate 21. If for any reason the drain region 66 assumes a negative potential, electrons are implanted into the substrate 21. In the second embodiment shown in FIG. 5, the drain region 26 is surrounded by the $P^+$-embedded layer 23, with the result that implantation of electrons into the substrate 21 does not affect the drain region 26 at all. However, in the case of the MOS transistor 40 described in connection with the first embodiment, the electrons implanted into the substrate 21 reach a depletion layer present between the substrate 21 and the island region 22A, with the result that the electrons will drift and flow to the drain electrode 32. Such an undesired electric current induces heat generation and variations in potential, which may in turn hinder the operation of the field MOS transistor.

Application Circuit 3

Figure 6:
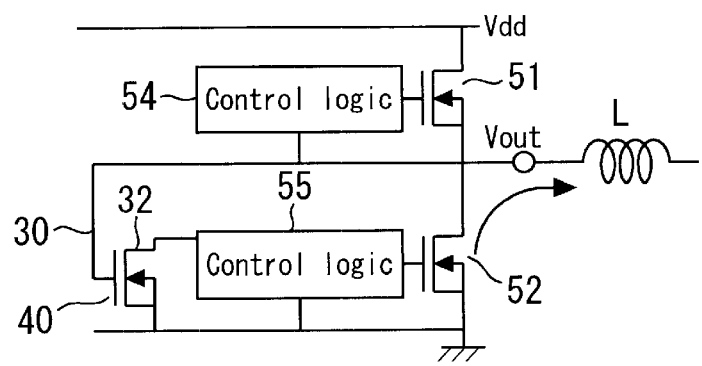
FIG. 6 is an electric schematic diagram showing the application circuit of the field MOS transistor according to the second embodiment.

FIG. 6 is an electric schematic diagram showing the application circuit of the field MOS transistor according to the second embodiment. The field MOS transistor described in connection with the second embodiment shown in FIG. 5 is used as the field MOS transistor 40 in an application circuit 3 shown in FIG. 6. The gate electrode 30 of the transistor 40 is connected to the output voltage Vout located between the N-channel MOS transistors 51 and 52. The drain electrode 32 is connected to the control logic circuit 55, and a voltage corresponding to the output voltage Vout is fed back to the control logic circuit 55. In this circuit, an inductance L is connected to Vout. When Vout assumes a negative potential by means of the inductance L, electrons are implanted into the substrate 21, as described in connection with the second embodiment. However, in the second embodiment, the drain region 26 of the transistor 40 is surrounded by the embedded layer 23, and hence implantation of electrons exerts no adverse effects on the drain region 26.

Third Embodiment

Figure 7:
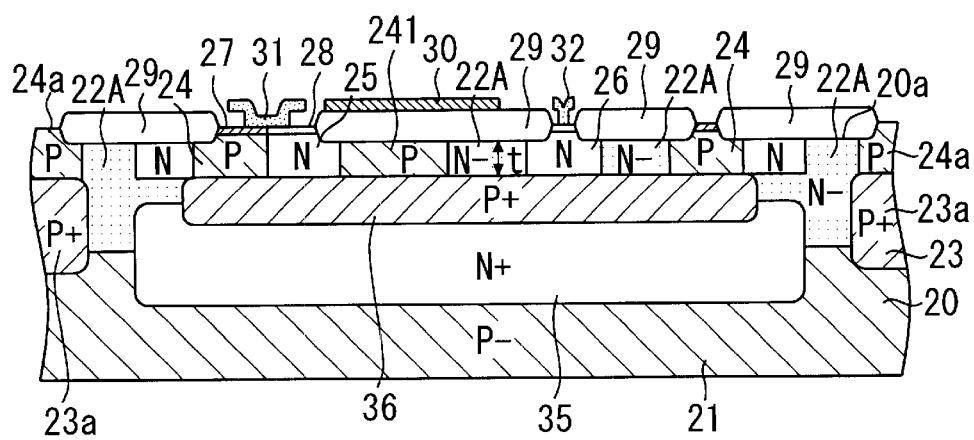
FIG. 7 is a cross-sectional view showing a field MOS transistor according to a third embodiment.

FIG. 7 is a cross-sectional view showing a field MOS transistor according to a third embodiment of the present invention.

In the third embodiment, an $N^+$-embedded layer 35 of second conductivity type; i.e., N-type, having a high doping level is formed below the island region 22A of the epitaxial layer 22. The $N^+$-embedded layer 35 is formed so as to extend between and be joined to the semiconductor substrate 21 and the island region 22A. The $N^+$-embedded layer 35 is disposed inside the internal periphery of the $P^+$-heavily-doped isolation layer 23a but spaced away from the $P^+$-heavily-doped isolation layer 23a. A $P^+$-embedded layer 36 is formed on and joined to the $N^+$-embedded layer 35. As in the case of the extended portion 23b described in connection with the first and second embodiments, the $P^+$-embedded layer 36 is formed simultaneously with formation of the heavily-doped isolation layer 23a of the embedded layer 23. Further, the $P^+$-embedded layer 36 assumes the same profile of doping level as that of the heavily-doped isolation layer 23a. The source region 25, the channel formation region 241, and the drain region 26 are formed such that the lower surface of the field insulating film 29 is joined to the $P^+$-embedded layer 36. As in the second embodiment shown in FIG. 5, the drain region 26 is formed a distance away from the channel formation region 241 and the P-well 24.

In the third embodiment shown in FIG. 7, an element withstand voltage is determined by means of a p-n junction formed between the $N^+$-embedded layer 35, the island region 22A of the epitaxial layer 22, and the substrate 21; a p-n junction formed between the $N^+$-embedded layer 35 and the island region 22A; and a p-n junction formed between the P-well 24 and the channel formation region 241. The element withstand voltage can be ensured up to a level which is Vdd higher than the potential of the substrate 21.

The $N^+$-embedded layer 35 can be formed simultaneously with the drain 66 of another N-channel transistor 52 shown in FIG. 5.

Application Circuit 4

Figure 8:
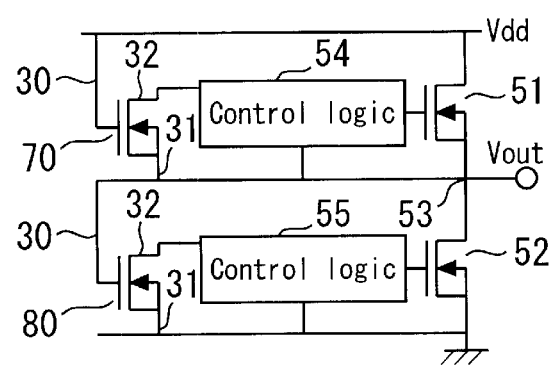
FIG. 8 is an electric schematic diagram showing the application circuit of the field MOS transistor according to the third embodiment.
Figure 9:
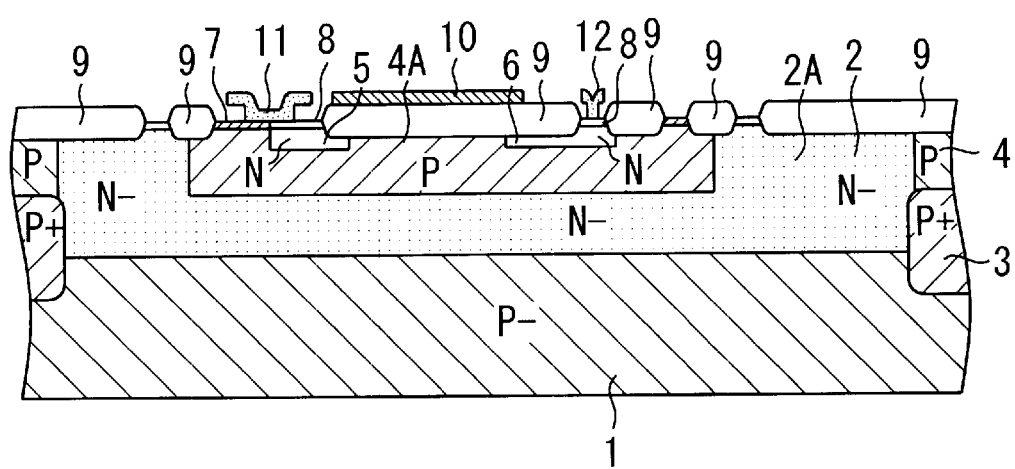
FIG. 9 shows the configuration of a field MOS transistor in a related art.

FIG. 8 is an electric schematic diagram showing a circuit to which the field MOS transistor according to the third embodiment is applied. A pair of field MOS transistors 70 and 80 according to the third embodiment are used in the application circuit. In the transistors 70 and 80, the gate electrode 30 of the power-side transistor 70 is connected to Vdd, and the source electrode 31 of the transistor 70 is connected to Vout. Further, the drain electrode 32 of the transistor 70 is connected to the control logic circuit 54. The gate electrode 30 of the ground-side transistor 80 is connected to Vout, and the source electrode 31 of the same is grounded. Further, the drain electrode 32 of the transistor 80 is connected to the control logic circuit 55.

In the application circuit, the maximum voltage Vdd is applied to the terminals of the power-side transistor 70. By means of the configuration described in connection with the third embodiment, the transistor 70 can withstand the maximum voltage Vdd.

The field MOS transistor 40 shown in FIG. 3, the field MOS transistor 40A shown in FIG. 4, the field MOS transistor 70 shown in FIG. 6, and the field MOS transistor 80 shown in FIG. 8 are embodied as semiconductor integrated circuits fabricated in the command semiconductor base member 20 in conjunction with the transistors 51 and 52. These field MOS transistors can be formed separately as discrete elements.

As mentioned above, in the field MOS transistor, the channel formation region is formed with substantially the same doping level as that of the lightly-doped isolation layer. Hence, the element withstand voltage of the MOS transistor can be increased, thus simplifying manufacturing processes.

If a region having substantially the same doping level as that of the heavily-doped isolation layer is formed below the island region and if the channel formation region is formed so as to be joined to the formed region, a back-gate voltage is effectively supplied by the formed region. Thus, the region below the island region can be simply formed simultaneously with the heavily-doped isolation layer.

If a region having substantially the same doping level as that of the heavily-doped isolation layer is formed below the island region, and if the channel formation region, the source region, and the drain region are formed so as to be joined to the formed region, there can be prevented adverse effects which would otherwise be caused by implantation of electrons into the substrate, while a back-gate voltage is effectively supplied by the region below the island region. Further, the region below the island region can also be formed simply and simultaneously with the heavily-doped isolation layer.

An embedded layer of second conductivity type is formed below an island region of the epitaxial layer, and an embedded layer of first conductivity type is formed on the embedded layer of second type. The channel formation region, the source region, and the drain region are formed so as to be joined to the embedded layer of first conductivity type. As a result, the withstand voltages of individual sections can be improved. So long as the embedded layer of first conductivity type is formed so as to assume substantially the same doping level as that of the heavily-doped isolation layer, and the channel formation region is formed so as to assume substantially the same doping level as that of the lightly-doped isolation layer, manufacturing processes can also be simplified.

In association with an improvement in the element withstand voltage of the field MOS transistor, the withstand voltage of the semiconductor integrated circuit having the field MOS transistor incorporated therein can be improved. Further, manufacturing processes can also be simplified.

Obviously many modifications and variations of the present invention are possible in the light of the above teachings. For example, in the embodiments mentioned above, the extended portion 23b extends from a portion of the internal periphery of the ring-shaped portion 23a. However, the extended portion 23b may be separated from the ring-shaped portion 23a. In other words, the heavily-doped embedded layer 23 may have a ring-shaped portion 23a and another portion separate from the ring-shaped portion 23a. It is therefore to be understood that within the scope of the appended claims the invention may by practiced otherwise than as specifically described.

The entire disclosure of a Japanese Patent Application No. 2000-367211, filed on Dec. 1, 2000 including specification, claims, drawings and summary, on which the Convention priority of the present application is based, are incorporated herein by reference in its entirety.

What is claimed is:

1. A field MOS transistor comprising:
a semiconductor substrate of first conductivity type;
an epitaxial layer of second conductivity type formed on the semiconductor substrate;
a field insulating film formed on the epitaxial layer;
a heavily-doped isolation layer of first conductivity type formed in a predetermined location on the semiconductor substrate, the heavily-doped isolation layer surrounding an island region of the epitaxial layer;
a lightly-doped isolation layer of first conductivity type formed on the heavily-doped isolation layer, the lightly-doped isolation layer, along with the heavily-doped isolation layer, surrounding the island region of the epitaxial layer;
a channel formation region formed so as to be joined to a lower surface of the field insulating film, the channel formation region having substantially the same doping level as that of the lightly-doped isolation layer;
a gate electrode formed on the field insulating film above the channel formation region; and
a source region and a drain region of second conductivity type respectively formed within the island region of the epitaxial layer and on the opposite sides of the channel formation region.

2. The field MOS transistor according to claim 1, further comprising an extended region extending below the island region of the epitaxial layer, the extended region having substantially the same doping level as that of the heavily-doped isolation layer; and
wherein the channel formation region is formed on the extended region.

3. The field MOS transistor according to claim 2, wherein the extended region is extended from the heavily-doped isolation layer.

4. The field MOS transistor according to claim 1, further comprising an extended region extending below the island region of the epitaxial layer, the extended region having substantially the same doping level as that of the heavily-doped isolation layer; and
wherein the channel formation region, the source region and the drain region are formed on the extended region.

5. The field MOS transistor according to claim 3, wherein the extended region is extended from the heavily-doped isolation layer.

6. The field MOS transistor according to claim 1, wherein a source electrode is located on the source region, and a drain electrode is located on the drain region.

7. A semiconductor integrated circuit including the field MOS transistor as defined in claim 1.

8. A field MOS transistor comprising:
a semiconductor substrate of first conductivity type;
an epitaxial layer of second conductivity type formed on the semiconductor substrate;
a field insulating film formed on the epitaxial layer;
a heavily-doped isolation layer of first conductivity type formed in a predetermined location on the semiconductor substrate, the heavily-doped isolation layer surrounding an island region of the epitaxial layer;
a lightly-doped isolation layer of first conductivity type formed on the heavily-doped isolation layer, the lightly-doped isolation layer, along with the heavily-doped isolation layer, surrounding the island region of the epitaxial layer;
an embedded layer of second conductivity type formed below an island region of the epitaxial layer;
an embedded layer of first conductivity type formed on the embedded layer of second conductivity type, the embedded layer having substantially the same doping level as that of the heavily-doped isolation layer;
a channel formation region of first conductivity type formed on the embedded layer of first conductivity type so as to be joined to a lower surface of the field insulating film, the channel formation region having substantially the same doping level as that of the lightly-doped isolation layer;
a gate electrode formed on the field insulating film above the channel formation region; and
a source region and a drain region of second conductivity type respectively formed within the island region of the epitaxial layer and on the opposite sides of the channel formation region;
the source region and the drain region of second conductivity type respectively formed on the embedded layer of first conductivity type and on the opposite sides of the channel formation region.

9. The field MOS transistor according to claim 8, wherein a source electrode is located on the source region, and a drain electrode is located on the drain region.

10. A semiconductor integrated circuit including the field MOS transistor as defined in claim 8.

* * * * *